US009941502B2

(12) United States Patent
Lu et al.

(10) Patent No.: US 9,941,502 B2
(45) Date of Patent: Apr. 10, 2018

(54) SIGNAL COLLECTION AND POWER CONNECTION ASSEMBLY, POWER BATTERY MODULE AND VEHICLE

(71) Applicant: BYD COMPANY LIMITED, Guangdong (CN)

(72) Inventors: Jia Lu, Guangdong (CN); Qingbo Peng, Guangdong (CN); Yan Zhu, Guangdong (CN); Xuefeng Zhang, Guangdong (CN); Wei Liu, Guangdong (CN); Yan Huang, Guangdong (CN); Zhipei Lu, Guangdong (CN); Jianhua Zhu, Guangdong (CN)

(73) Assignee: BYD COMPANY LIMITED, Shenzhen (CN)

( * ) Notice: Subject to any disclaimer, the term of this patent is extended or adjusted under 35 U.S.C. 154(b) by 0 days.

(21) Appl. No.: 15/189,927

(22) Filed: Jun. 22, 2016

(65) Prior Publication Data

US 2016/0301059 A1   Oct. 13, 2016

Related U.S. Application Data

(63) Continuation of application No. PCT/CN2014/095424, filed on Dec. 29, 2014.

(30) Foreign Application Priority Data

Dec. 31, 2013   (CN) .......................... 2013 1 0752292

(51) Int. Cl.
| | |
|---|---|
| *H01M 2/20* | (2006.01) |
| *B60L 11/18* | (2006.01) |
| *H01M 10/48* | (2006.01) |
| *H01M 2/22* | (2006.01) |
| *H01M 2/30* | (2006.01) |
| *H01M 10/42* | (2006.01) |

(52) U.S. Cl.
CPC ......... *H01M 2/206* (2013.01); *B60L 11/1851* (2013.01); *B60L 11/1879* (2013.01); (Continued)

(58) Field of Classification Search
CPC ............ B60L 11/1851; B60L 11/1879; H01M 10/425; H01M 10/482; H01M 2220/20; (Continued)

(56) References Cited

U.S. PATENT DOCUMENTS

| | | | |
|---|---|---|---|
| 5,999,410 A | 12/1999 | Weiler | |
| 6,146,788 A * | 11/2000 | Ikeda | H01M 2/206 429/121 |

(Continued)

FOREIGN PATENT DOCUMENTS

| | | |
|---|---|---|
| CN | 201303033 Y | 9/2009 |
| CN | 102339969 A | 2/2012 |

(Continued)

OTHER PUBLICATIONS

International Search Report and Written Opinion for PCT/CN2014/095424 dated Feb. 17, 2015, 11 pages.

*Primary Examiner* — Carlos Barcena

(57) ABSTRACT

A signal collection and power connection assembly of a power battery module, a power battery module and a vehicle are provided. The assembly includes a substrate, a power connection member fixed on the substrate, a power connection line formed by a first sheet-like conductor disposed on the substrate, a signal collection line formed by a second sheet-like conductor disposed on the substrate, and a signal collection member disposed on the substrate and coupled with the signal collection line. A terminal of the power connection line is coupled with the power connection member, and a terminal of the signal collection line is coupled with the power connection member.

19 Claims, 4 Drawing Sheets

(52) U.S. Cl.
CPC ............. *H01M 2/22* (2013.01); *H01M 2/305*
(2013.01); *H01M 10/425* (2013.01); ***H01M
10/482* (2013.01); *H01M 2220/20*** (2013.01);
*Y02T 10/7005* (2013.01); *Y02T 10/705*
(2013.01)

(58) Field of Classification Search
CPC ........ H01M 2/206; H01M 2/22; H01M 2/305;
Y02T 10/7005; Y02T 10/705
See application file for complete search history.

(56) References Cited

U.S. PATENT DOCUMENTS

| | | | |
|---|---|---|---|
| 7,794,875 B2 | 9/2010 | Yoon et al. | |
| 2012/0148876 A1* | 6/2012 | Zeng | H01M 10/4257 429/7 |
| 2012/0323511 A1* | 12/2012 | Saigo | H01M 2/206 702/63 |
| 2013/0335935 A1 | 12/2013 | Jung et al. | |
| 2014/0120393 A1 | 5/2014 | Desbois-Renaudin et al. | |

FOREIGN PATENT DOCUMENTS

| | | |
|---|---|---|
| CN | 102544616 A | 7/2012 |
| CN | 102859751 A | 1/2013 |
| CN | 202957336 U | 5/2013 |
| DE | 102012205020 A1 | 10/2013 |
| JP | 2004-031858 A | 1/2004 |
| JP | 2005183587 A | 7/2005 |
| JP | 2006-165269 A | 6/2006 |
| JP | 2009-163932 A | 7/2009 |
| JP | 2009-526362 A | 7/2009 |
| JP | 2013-152918 A | 8/2013 |
| WO | 2012171668 A1 | 12/2012 |

* cited by examiner

SIGNAL COLLECTION AND POWER CONNECTION ASSEMBLY, POWER BATTERY MODULE AND VEHICLE

CROSS-REFERENCE TO RELATED APPLICATION

This application is a continuation application of International Application No. PCT/CN2014/095424, filed Dec. 29, 2014, which is based upon and claims priority to Chinese Patent Application No. 201310752292.X, filed with the State Intellectual Property Office of P. R. China on Dec. 31, 2013. The entire content of the above-identified application is incorporated herein by reference.

FIELD

Embodiments of the present disclosure relate to power batteries, and more particularly to a signal collection and power connection assembly of a power battery module, a power battery module including the assembly, and a vehicle including power battery module.

BACKGROUND

A signal collection module in the related art usually performs signal collection and power connection via wires. This kind of signal collection module has poor universality. Once types of signals (such as pressure, concentration, humidity, etc.) required to be collected in the environment are increased, this kind of signal collection module cannot operate normally. If additional sensing units are added, the whole design of the signal collection module needs to be adjusted. Moreover, in this type of signal collection module, the battery connection sheet and the FPC needs to be connected with each other by welding or hot pressing, and then welded to an electrode terminal of the battery. In other words, two-step forming is required. The two-step forming causes an increase in the complexity of manufacture and use as well as a decrease of reliability of the signal collection module.

SUMMARY

Embodiments of the present disclosure seek to solve at least one of the problems existing in the related art to at least some extent.

Embodiments of an aspect of the present disclosure provide a signal collection and power connection assembly of a power battery module. The assembly includes: a substrate; a power connection member fixed on the substrate; a power connection line which is formed by a first sheet-like conductor disposed on the substrate and includes a first terminal coupled with the power connection member and a second terminal; a signal collection line which is formed by a second sheet-like conductor disposed on the substrate and includes a first terminal coupled with the power connection member and a second terminal; and a signal collection member disposed on the substrate and coupled with the signal collection line.

With the signal collection and power connection assembly of the power battery module according to embodiments of the present disclosure, each of the power connection line and the signal collection line may be formed by a sheet-like conductor disposed on the substrate, i.e. using wires to perform signal transmission and power connection which is normally adopted in the related art is avoided. The signal collection and power connection assembly of a power battery module according to embodiments of the present disclosure is convenient to mold and good in universality. Further, the assembly is convenient and reliable in use. For example, when types of signals required to be collected in the environment are increased, it is convenient to add additional signal collecting units into the assembly, without adjusting the whole structure of the assembly.

In addition, the power connection line, the signal collection line, the power connection member and the signal collection line are all integrated onto the substrate, such that the assembly is simple to produce and assemble, small in volume, light in weight, low in cost, and suitable for automatic manufacturing. With the signal collection and power connection assembly of the power battery module according to embodiments of the present disclosure, the assembling efficiency may be improved. Still further, the assembly has functions of both signal transmission and power transmission, thus being convenient and simple in operation. Moreover, the assembly has simple structure and various arranging manners, and therefore the assembly may be widely used and have better universality.

Embodiments of another aspect of the present disclosure provide a power battery module. The power battery module includes: a battery group including a plurality of batteries each including an electrode terminal; and the above-identified signal collection and power connection assembly of the power battery module, in which the electrode terminals of adjacent batteries are connected by the power connection member of the assembly.

With the power battery module according to embodiments of the present disclosure, the signal collection and power connection assembly of the power battery module may cover the properly arranged batteries, and then the electrode terminal of each battery may be connected with the power connection member of the assembly. Therefore, a step of using additional power connection members to achieve power connection between batteries may be avoided. Further, as the assembly is softer than a conventional power connection member, addition of a buffering mechanism which is usually adopted in the manufacturing process of the conventional power connection member is avoided, thus facilitating the manufacturing process and saving the manufacturing cost. In addition, in the assembly and power battery module according to embodiments of the present disclosure, a power connection part (for example, including the power connection line and the power connection member) and a signal collection part (for example, including the signal collection line and the signal collection member) are integral, thus being more reliable.

Embodiments of a further aspect of the present disclosure provide a vehicle. The vehicle includes the above-identified power battery module.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
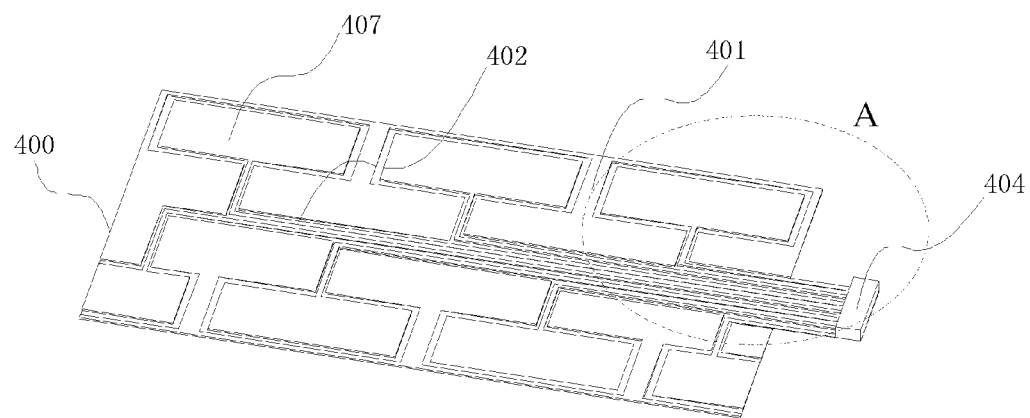
FIG. 1 is a schematic view of a signal collection and power connection assembly of a power battery module according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In the specification, it should be understood that, the terms such as "central", "longitudinal", "lateral", "width", "thickness", "above", "below", "front", "rear", "right", "left", "vertical", "horizontal", "top", "bottom", "inner", "outer", "clockwise", "counter-clockwise" should be construed to refer to the orientation as then described or as shown in the drawings. These terms are merely for convenience and concision of description and do not alone indicate or imply that the device or element referred to must have a particular orientation. Thus, it cannot be understood to limit the present disclosure.

In addition, terms such as "first" and "second" are used herein for purposes of description and are not intended to indicate or imply relative importance or significance or impliedly indicate quantity of the technical feature referred to. Thus, the feature defined with "first" and "second" may comprise one or more this feature. In the description of the present disclosure, "a plurality of" means two or more than two this features, unless specified otherwise.

In the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the following, a signal collection and power connection assembly 400 of a power battery module according to embodiments of the present disclosure may be described with reference to FIGS. 1-5.

Figure 2:
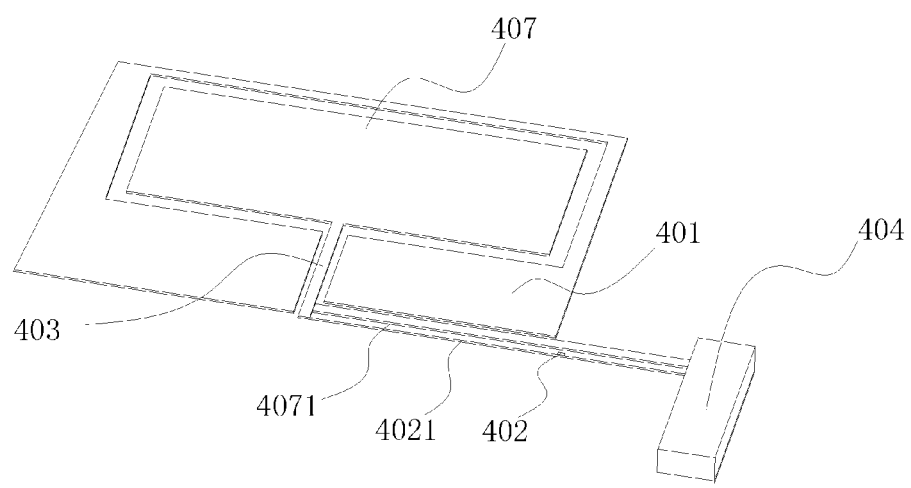
FIG. 2 is an enlarged view of part A in FIG. 1.

As shown in FIGS. 1-2, the signal collection and power connection assembly 400 of the power battery module according to embodiments of the present disclosure include a substrate 401, a power connection member 407, a power connection line 4071, a signal collection line 4021, and a signal collection member 402.

In some embodiments, the power connection member 407 is fixed on the substrate 401. The power connection line 4071 is formed by a first sheet-like conductor disposed on the substrate 401. A first terminal of the power connection line 4071 is coupled with the power connection member 407. The signal collection line 4021 is formed by a second sheet-like conductor disposed on the substrate 401. A first terminal of the signal collection line 4021 is coupled with the power connection member 407. The signal collection member 402 is disposed on the substrate 402 and coupled with a second terminal of the signal collection line 4021.

With the assembly 400 according to embodiments of the present disclosure, the power connection line 4071 and the signal collection line 4021 may be each formed by a sheet-like conductor disposed on the substrate 401, i.e. using wires to perform signal transmission and power connection which is normally adopted in the related art is avoided. The assembly 400 according to embodiments of the present disclosure is convenient to mold and good in universality. Further, the assembly 400 is convenient and reliable in use. For example, when types of signals required to be collected in the environment are increased, it is convenient to add additional signal collecting units into the assembly, without adjusting the whole structure of the assembly.

In addition, the power connection line 4071, the signal collection line 4021, the power connection member 407 and the signal collection line 402 are all integrated onto the substrate 401, such that the assembly 400 is simple to produce and assemble, small in volume, light in weight, low in cost, and suitable for automatic manufacturing. With the assembly 400 according to embodiments of the present disclosure, the assembling efficiency may be improved. Still further, the assembly 400 has functions of both signal transmission and power transmission, thus being convenient and simple in operation. Moreover, the assembly 400 has a simple structure and various arranging manners, and therefore the assembly 400 may be widely used and have better universality.

The power connection line 4071 may be formed by a sheet-like conductor for power connection, and the signal collection line 4021 may be formed by a sheet-like conductor for signal collection. In one embodiment, the power connection line 4071 and the signal collection line 4021 may be two conductive lines independent of one another. Alternatively, a part of the power connection line 4071 and a part of the signal collection line 4021 may be integrated, while remaining parts of the power connection line 4071 and the signal collection line 4021 may be independent of one another.

In some embodiments, the assembly 400 further includes a common line 403. The common line 403 may be formed by a sheet-like conductor disposed on the substrate 401. A first terminal of the common line 403 is coupled with the power connection member 407, and a second terminal of the common line 403 is coupled with the first terminals of the power connection line 4071 and the signal collection line 4021 respectively, as shown in FIG. 2.

In other words, the part of the power connection line 4071 which is coupled with the power connection member 407 and the part of the signal collection line 4021 which is coupled with the power connection member 407 are integrated via the common line 403, and therefore the common line 403 may both perform power connection with the power connection line 4071 and perform signal transmission with the signal collection line 4021. With the assembly 400 according to embodiments of the present disclosure, a part of the power connection line 4071 and a part of the signal collection line 4021 are integrated, which facilitates the integrity and simplifies the structure of the assembly 400.

In some embodiments, the assembly 400 further includes a connector 404. The connector 404 is coupled with the second terminals of the power connection line 4071 and the signal collection line 4021 respectively. The connector 404 is configured to electrically connect with the power connection line 4071 and the signal collection line 4021, and further to connect with an external signal output device and an external power connection device. There are no particular limits on the structure of the connector 404, for example, the connector 404 may be any conventional flexible printed circuit (FPC) connector or printed circuit board (PCB) connector.

There are no particular limits on the assembly between the connector 404 and the substrate 401, provided requirements of signal transmitting and power connection between the assembly 400 and an external signal output device or an external power connection device are satisfied. In some embodiments, the connector 404 is disposed on the substrate 401. In some embodiments, the connector 404 is disposed at an edge of the substrate 401. Accordingly, the second terminals of the power connection line 4071 and the signal collection line 4021 both extend to the edge of the substrate 401, thus facilitating the connection between the connector 404 and the external signal output device or the external power connection device.

In some embodiments, the substrate 401 is a flexible board. When the assembly 400 is used to connect power batteries of a power battery module, the flexible board may buffer a relative displacement and an assembly tolerance between the power batteries, thus improving the reliability of the power battery module.

In some embodiments, the substrate 401 is a protective film disposed on two sides of the FPC board, and is flexible. For example, the substrate 401 may be a polyimide (PI) film. The connector 404 is connected with the substrate 401, and the substrate 401 may be connected with the external signal output device or the external power connection device via the connector 404. The connection between the connector 404 and the substrate 401 may be achieved by at least one of welding and mechanical connection. The FPC connector and PCB connector are well-known to those having ordinary skill in the art, and thus detailed descriptions thereof are omitted herein.

There are no particular limits on structures of the signal collection line 4021 and the power connection line 4071, and the manners for assembling the signal collection line 4021 and the power connection line 4071 on the substrate 401. In some embodiments, at least one of the power connection line 4071 and the signal collection line 4021 is formed by a conductive metal sheet fixed on the substrate 401. In an embodiment, the conductive metal sheet that constitutes at least one of the power connection line 4071 and the signal collection line 4021 is fixed on the substrate 401 by at least one of adhering, injection molding, hot pressing and welding.

In other words, the power connection line 4071 and the signal collection line 4021 may be integrated onto the substrate 401 by adhering, injection molding, hot pressing, or welding. Therefore, the power connection line 4071 and the signal collection line 4021 may be conveniently integrated onto the substrate 401, which reduces the difficulty for forming the assembly 400.

In some embodiments, at least one of the power connection line 4071 and the signal collection line 4021 is formed by a conductive metal layer formed on the substrate 401. In some embodiments, the conductive metal layer that constitutes at least one of the power connection line 4071 and the signal collection line 4021 is a conductive metal coating formed on the substrate 401. In other words, each of the power connection line 4071 and the signal collection line 4021 is a conductive metal coating formed on the substrate 401. The conductive metal coating may be formed by electroplating or chemical plating, thus facilitating forming the power connection line 4071 and the signal collection line 4021 on the substrate 401. In addition, two-step forming or connection is avoided. The power connection line 4071 and the signal collection line 4021 are both integrated onto the substrate 401, thus improving the accuracy and reliability of the signal transmission and power connection of the assembly 400.

In some embodiments, the substrate 401 is a flexible board, and at least one of the power connection line 4071 and the signal collection line 4021 is a conductive line formed by etching a conductive metal foil covering the substrate 401. In other words, the power connection line 4071 and the signal collection line 4021 are formed on the substrate 401 by etching, thus facilitating forming the power connection line 4071 and the signal collection line 4021 onto the substrate 401.

In some embodiments, a line slot (not shown) is formed in a surface of the substrate 401, and at least one of the power connection line 4071 and the signal collection line 4021 is disposed in the line slot, thus arranging the power connection line 4071 and the signal collection line 4021 into the line slot in a surface of the substrate 401. The line slot may be used to protect the power connection line 4071 and the signal collection line 4021, thus improving a use reliability of the assembly 400.

There are no particular limits on methods of disposing the power connection line 4071 and the signal collection line 4021 into the line slot. In some embodiments, at least one of the power connection line 4071 and the signal collection line 4021 is formed by a conductive metal sheet fixed in the line slot or a conductive metal coating formed in the line slot. In some embodiments, at least one of the power connection line 4071 and the signal collection line 4021 is a conductive line formed by etching a conductive metal foil in the line slot. The structure of the power connection line 4071 and the signal collection line 4021 in the present embodiment is substantially the same as that described above, and thus detailed descriptions thereof are omitted herein.

The structure of the signal collection member 402 may be suitably selected according to data or signals required to be collected. In some embodiments, the signal collection member 402 includes at least one of a temperature sensing element, a humidity sensing element, a pressure sensing element, a concentration sensing element, and a voltage sensing element. In other words, the signal collection member 402 may be selected from a temperature sensing element, a humidity sensing element, a pressure sensing element, a concentration sensing element, a voltage sensing element, and combinations thereof. There are no particular limits on the signal collection member 402, and it may be reasonably selected according to practical requirements.

During the assembling process of the assembly 400, the signal collection member 402 is fixed onto the substrate 401 and connected with the signal collection line 4021. When the assembly 400 is connected with power batteries, signals such as temperature and gas pressure of the battery, concentration and humidity of the electrolyte may be collected via the signal collection member 402, without adding additional units into the assembly 400. Therefore, the assembly 400 according to embodiments of the present disclosure is convenient in use. Further, data of the power battery may be collected efficiently by the assembly 400, thus ensuring the accuracy of data collected by the assembly 400.

In the following, the structure of the power connection member 407 and the manner for assembling the power connection member 407 on the substrate 401 will be described in detail with reference to detailed embodiments.

In some embodiments, the power connection member 407 is formed by a sheet-like conductor fixed on the substrate 401. In other words, the power connection member 407 may be in the form of a sheet-like conductor fixed on the substrate 401.

In some embodiments, the power connection member 407 is formed by a conductive metal sheet fixed on the substrate 401. In an embodiment, the conductive metal sheet that constitutes the power connection member 407 is fixed on the substrate 401 by at least one of adhering, injection molding, hot pressing, and welding. In other words, the power connection member 407 may be a conductive metal sheet integrated onto the substrate 401 by adhering, injection molding, hot pressing, or welding. Thus, the power connection member 407 may be integrated onto the substrate 401 conveniently, and the difficulty for forming the assembly 400 is reduced.

In some embodiments, the power connection member 407 is formed by a conductive metal layer formed on the substrate 401. In an embodiment, the conductive metal layer that constitutes the power connection member 407 is a conductive metal coating formed on the substrate 401. In other words, the power connection member 407 may be a conductive metal coating formed on the substrate 401 by electroplating or chemical plating. Thus, the power connection member 407 may be formed and integrated onto the substrate 401 conveniently, and two-step forming or connection is avoided, thus improving the accuracy and reliability of the power connection of the assembly 400.

In some embodiments, the power connection member 407 is a conductive region formed by etching a conductive metal foil covering the substrate 401, thus facilitating forming the power connection member 407 onto the substrate 401.

In some embodiments, a groove (not shown) is formed in a surface of the substrate 401, and the power connection member 407 is fixed into the groove. By arranging the power connection member 407 into the groove in the surface of the substrate 401, the groove may be used to protect the power connection member 407, thus improving the reliability of the assembly 400.

There are no particular limits on the manner of arranging the power connection member 407 into the groove. In some embodiments, the power connection member 407 is formed by a conductive metal sheet fixed in the groove or by a conductive metal coating formed in the groove. In some embodiments, the power connection member 407 is formed by etching a conductive metal foil in the groove. The structure of the power connection member 407 in the present embodiment is substantially similar to that described above, and thus detailed descriptions thereof are omitted herein.

When the assembly 400 according to embodiments of the present disclosure is in use, the power connection member 407 is connected with electrode terminals of two adjacent power batteries respectively. The number of power batteries that are connected depends on the number of power connection members 407. The arrangement of the power connection members 407 may be suitably adjusted according to the arrangement of different power batteries. In some embodiments, a plurality of power connection members 407 are provided and spaced apart from each other.

In some embodiments, the power connection members 407 are arranged in a plurality of rows parallel to each other. In an embodiment, the power connection members 407 are arranged in two rows extending along opposing first and second sides of the substrate 401 respectively. Accordingly, the signal collection line 4021 and the power connection line 4071 are disposed between two adjacent rows of power connection members 407 and connected with corresponding power connection members 407 respectively. Thus, the assembly 400 may be used for a power battery module including a plurality of power batteries arranged in parallel with each other. The power connection members 407 may be connected to electrode terminals of power batteries that are adjacent to the power connection members 407 and parallel to each other respectively. The power connection line 4071 and the signal collection line 4021 may be used to perform power connection and signal transmitting between the power batteries and an external device.

As shown in FIG. 2, in an embodiment, the signal collection line 4021 and the power connection line 4021 coupled with the same power connection member 407 are arranged in parallel with each other. Therefore, the power connection line 4071 and the signal collection line 4021 are spaced apart from each other and may not interfere with each other, thus ensuring the connection reliability of the power connection line 4071 and the transmitting accuracy of the signal collection line 4021.

In some embodiments, the assembly 400 further includes a protection film (not shown) for covering the power connection member 407, the signal collection member 402, the signal collection line 4021, and the power connection line 4071. In an embodiment, the protection film may be used to integrate the power connection member 407, the signal collection member 402, the signal collection line 4021 and the power connection line 4071 onto the substrate 401. The protection film is pressure resistant, insulating, and wear resistant, thus improving a sealing performance of the assembly 400. In this way, the power connection line 4071, the signal collection line 4021, and related members may be protected by the protection film, and the safety and reliability of the assembly 400 are both improved.

In some embodiments, the assembly 400 is configured as a FPC board, and the power connection member 407, the power connection line 4071 and the signal collection line 4021 are formed on the FPC board by etching. In some embodiments, the FPC board includes a conductive metal foil and a protective film (not shown) covering two sides of the conductive metal foil. The protective film is formed by the substrate 401, and the power connection member 407, the power connection line 4071 and the signal collection line 4021 are formed by etching the conductive metal foil. In some embodiments, a protection film covers the protective film at a side of the conductive metal foil.

In other words, the assembly 400 is in the form of a FPC board, the FPC board includes a conductive metal foil and a protective film disposed on the conductive metal foil, the protective film is a part of the substrate 401, and the power connection member 407, the power connection line 4071 and the signal collection line 4021 are formed by etching the conductive metal foil.

Those having ordinary skills in the related art will understand that, the common line 403 may be disposed on the substrate 401 in the same manner as described above for the power connection line 4071 and the signal collection line 4021. In some embodiments, the common line 403 is formed on the FPC board by etching. The first terminal of the common line 403 is coupled with the power connection member 407, and the second terminal of the common line 403 is coupled with the first terminals of the power connection line 4071 and the signal collection line 4021 respectively. Therefore, the forming process of the assembly 400 is further simplified, and the reliability of the assembly 400 is ensured.

In some embodiments, the assembly 400 further includes a connector 404. The connector 404 is coupled with the second terminals of the power connection line 4071 and the signal collection line 4021 respectively. In some embodiments, the connector 404 is disposed on the substrate 401. In some embodiments, the connector 404 is disposed at an edge of the substrate 401. The second terminals of the power connection line 4071 and the signal collection line 4021 extend to the edge of the substrate 401. The structure and arrangement of the connector 404 are substantially the same as those described above, and thus detailed description thereof are omitted herein.

In the following, a power battery module according to embodiments of the present disclosure will be described with reference to FIGS. 3-5.

Figure 3:
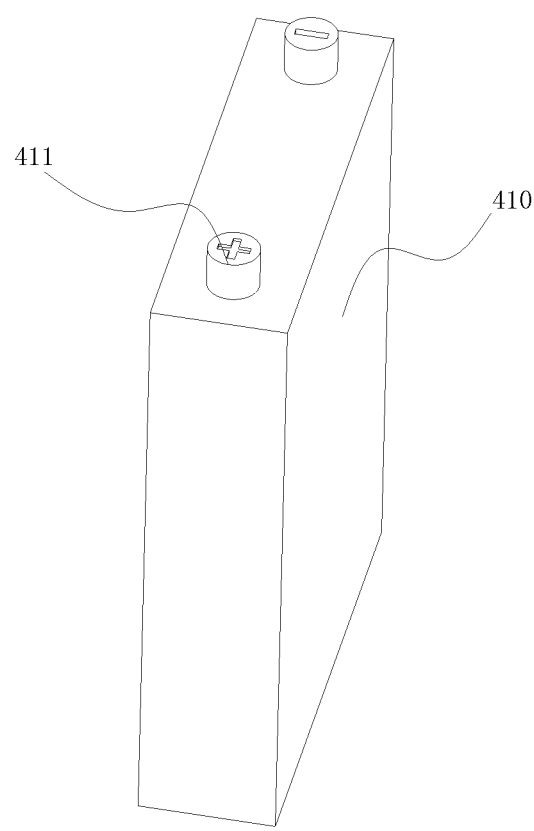
FIG. 3 is a schematic view of a battery of a power battery module according to an embodiment of the present disclosure.
Figure 4:
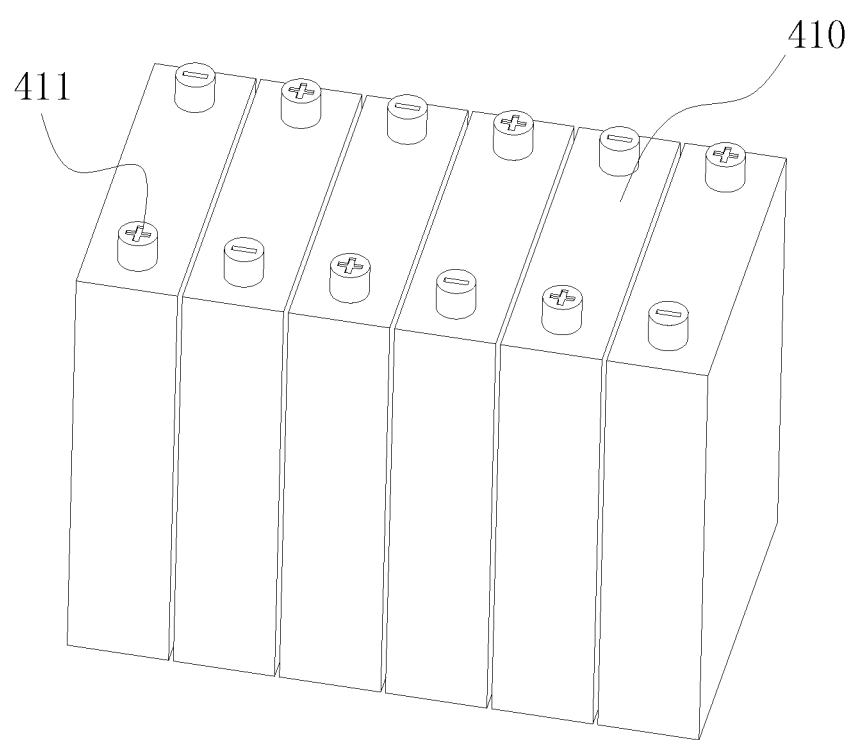
FIG. 4 is a schematic view of a power battery module according to an embodiment of the present disclosure.
Figure 5:
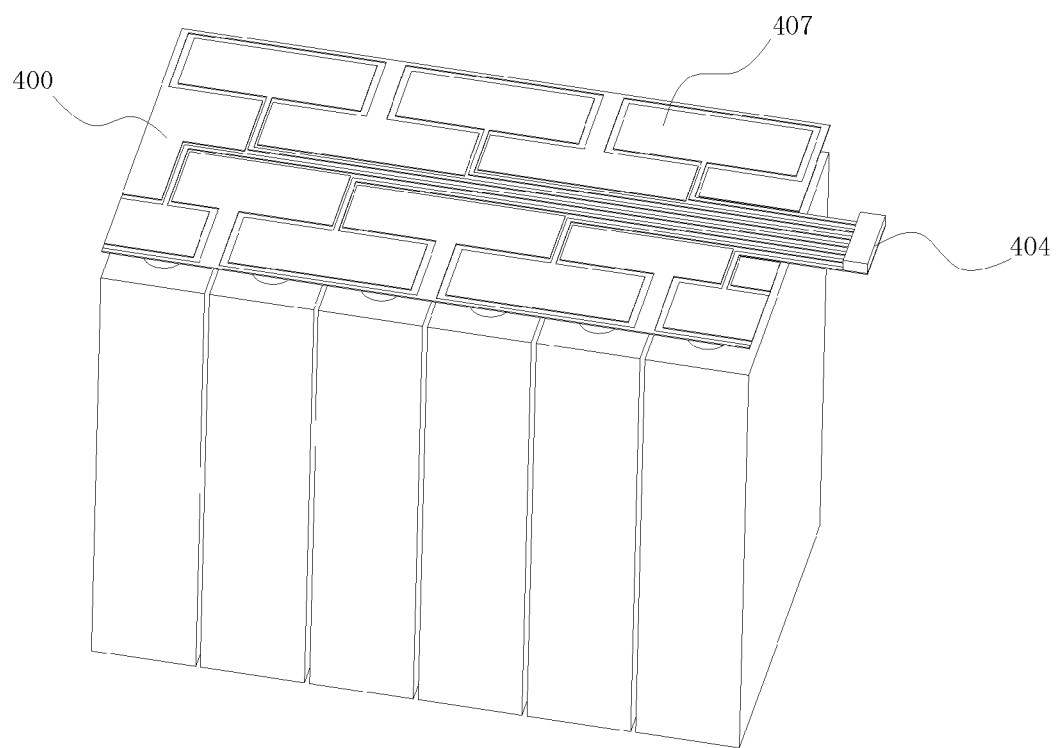
FIG. 5 is a schematic view of a power battery module according to an embodiment of the present disclosure, in which a signal collection and power connection assembly of a power battery module is assembled into the power battery module.

As shown in FIGS. 3-5, the power battery module according to embodiments of the present disclosure includes a battery group and the above-identified assembly 400. The battery group includes a plurality of batteries 410, and each battery has an electrode terminal 411. The assembly 400 is the signal collection and power connection assembly of the power battery module as described above, and electrode terminals of adjacent batteries are connected via the power connection member 407 of the assembly 400.

The power battery module includes the assembly 400, and thus functions described above for the assembly 400 may also apply to the power battery module, i.e. using wires to perform signal transmission and power connection which is normally adopted in the related art is avoided. The signal collection and power connection assembly 400 of the power battery module according to embodiments of the present disclosure is convenient to mold and good in universality. Further, the assembly is convenient and reliable in use. For example, when types of signals required to be collected in the environment are increased, it is convenient to add additional signal collecting units into the assembly, without adjusting the whole structure of the assembly.

With the power battery module according to embodiments of the present disclosure, the signal collection and power connection assembly of the power battery module may cover the properly arranged batteries, and then the electrode terminal of each battery may be connected with the power connection member of the assembly. Therefore, a step of using additional power connection members to achieve power connection between batteries may be avoided. Further, as the assembly is softer than a conventional power connection member, addition of a buffering mechanism which is usually adopted in the manufacturing process of the conventional power connection member is avoided, thus facilitating the manufacturing process and saving the manufacturing cost. In addition, in the assembly and power battery module according to embodiments of the present disclosure, a power connection part (for example, including the power connection line and the power connection member) and a signal collection part (for example, including the signal collection line and the signal collection member) are integral, thus being more reliable.

There are no particular limits on the method of connecting the power connection member 407 and the battery 410, for example, the power connection member 407 and the battery 410 are connected by welding or bolt connections. In some embodiments, the power connection member 407 and the electrode terminal 411 of the battery 410 are connected by welding. In some embodiments, a mounting hole is formed in the assembly 400, a fixing element (not shown) is formed on the battery group, and the assembly 400 is pre-positioned onto the battery group by the connection between the mounting hole and the fixing element. Various kinds of connection methods may be applied to connect the assembly 400 and the battery group, thus improving the universality of the assembly 400 and the power battery module according to embodiments of the present disclosure.

There are no particular limits on the method of connecting batteries 410. In some embodiments, the plurality of batteries 410 are collected in a parallel manner, a series manner, or a parallel-series manner, and the batteries 410 may be connected by at least one of impulse welding, laser welding, or mechanical connection.

Embodiments of the present disclosure further provide a vehicle. The vehicle includes the above-identified power battery module. Those with ordinary skill in the art will understand that, the vehicle includes the above-identified power battery module while the power battery module includes the assembly 400, so functions of the power battery module and the assembly 400 as described above may also be applied to the vehicle. Further, other members of the vehicle and operations thereof are well known to those skilled in the art, and therefore detailed descriptions thereof are omitted herein.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A signal collection and power connection assembly of a power battery module, comprising:
    a substrate;
    a power connection member fixed on the substrate;
    a power connection line which is formed by a first sheet-like conductor disposed on the substrate and defines a first terminal coupled with the power connection member and a second terminal;
    a signal collection line which is formed by a second sheet-like conductor disposed on the substrate and defines a first terminal coupled with the power connection member and a second terminal;
    a signal collection member disposed on the substrate and coupled with the signal collection line; and
    a common line formed by a sheet-like conductor disposed on the substrate;
    wherein the common line defines a first terminal coupled with the power connection member and a second terminal coupled with the first terminals of the power connection line and the signal collection line respectively, a part of the power connection line and a part of the signal collection line are integrated via the common line, such that the common line is configured to provide power connection with the power connection line and signal transmission with the signal collection line.

2. The assembly according to claim 1, wherein the second terminals of the power connection line and the signal collection line are both extended to an edge of the substrate.

3. The assembly according to claim 1, further comprising a connector coupled with the second terminals of the power connection line and the signal collection line respectively.

4. The assembly according to claim 3, wherein the connector is disposed on the substrate.

5. The assembly according to claim 4, wherein the connector is disposed at the edge of the substrate.

6. The assembly according to any of claims 1, wherein the substrate includes a flexible board.

7. The assembly according to claim 1, wherein at least one of the power connection line and the signal collection line is formed by a conductive metal sheet fixed on the substrate.

8. The assembly according to claim 7, wherein the conductive metal sheet is fixed on the substrate by at least one of adhering, injection molding, hot pressing and welding.

9. The assembly according to claim 1, wherein at least one of the power connection line and the signal collection line is formed by a conductive metal layer on the substrate.

10. The assembly according to claim 9, wherein the conductive metal layer includes a conductive metal coating formed on the substrate.

11. The assembly according to claim 1, wherein the substrate includes a flexible board, and at least one of the power connection line and the signal collection line includes a conductive line formed by etching a conductive metal foil covering the substrate.

12. The assembly according to claim 1, wherein the substrate includes a flexible board and comprises a line slot formed in a surface thereof, and at least one of the power connection line and the signal collection line is disposed in the line slot.

13. The assembly according to claim 12, wherein at least one of the power connection line and the signal collection line is formed by a conductive metal sheet fixed in the line slot or a conductive metal coating formed in the line slot.

14. The assembly according to claim 12, wherein at least one of the power connection line and the signal collection line is formed by etching a conductive metal foil in the line slot.

15. The assembly according to claim 1, wherein the signal collection member comprises at least one of a temperature sensing element, a humidity sensing element, a pressure sensing element, a concentration sensing element, and a voltage sensing element.

16. The assembly according to claim 1, wherein the power connection member is formed by a sheet-like conductor fixed on the substrate.

17. The assembly according to claim 1, wherein the power connection member is formed by a conductive metal sheet fixed on the substrate.

18. A power battery module comprising:
a battery group comprising a plurality of batteries each including an electrode terminal; and a signal collection and power connection assembly of the power battery module comprising:
a substrate;
a power connection member fixed on the substrate;
a power connection line which is formed by a first sheet-like conductor disposed on the substrate and defines a first terminal coupled with the power connection member and a second terminal;
a signal collection line which is formed by a second sheet-like conductor disposed on the substrate and defines a first terminal coupled with the power connection member and a second terminal;
a signal collection member disposed on the substrate and coupled with the signal collection line;
a common line formed by a sheet-like conductor disposed on the substrate,
wherein the common line defines a first terminal coupled with the power connection member and a second terminal coupled with the first terminals of the power connection line and the signal collection line respectively, a part of the power connection line and a part of the signal collection line are integrated via the common line, such that the common line is configured to provide power connection with the power connection line and signal transmission with the signal collection line, and the electrode terminals of adjacent batteries are connected by the power connection member of the assembly.

19. A vehicle comprising a power battery module, wherein the power battery module comprises:
a battery group comprising a plurality of batteries each including an electrode terminal; and a signal collection and power connection assembly of the power battery module including:
a substrate;
a power connection member fixed on the substrate;
a power connection line which is formed by a first sheet-like conductor disposed on the substrate and defines a first terminal coupled with the power connection member and a second terminal;
a signal collection line which is formed by a second sheet-like conductor disposed on the substrate and defines a first terminal coupled with the power connection member and a second terminal;
a signal collection member disposed on the substrate and coupled with the signal collection line;
a common line formed by a sheet-like conductor disposed on the substrate,
wherein the common line defines a first terminal coupled with the power connection member and a second terminal coupled with the first terminals of the power connection line and the signal collection line respectively, the part of the power connection line and the part of the signal collection line are integrated via the common line, such that the common line is configured to provide power connection with the power connection line and signal transmission with the signal collection line, and the electrode terminals of adjacent batteries are connected by the power connection member of the assembly.

* * * * *